United States Patent [19]

Epsom

[11] 4,383,334
[45] May 10, 1983

[54] INTERMODULATION CANCELLING MIXER

[75] Inventor: Robert L. Epsom, Hanover Park, Ill.

[73] Assignee: Motorola, Inc., Schaumburg, Ill.

[21] Appl. No.: 273,143

[22] Filed: Jun. 12, 1981

[51] Int. Cl.³ .......................... H04B 1/10; H04B 1/26
[52] U.S. Cl. .................................... 455/295; 455/304; 455/323; 455/325; 332/18; 332/37 R
[58] Field of Search ............... 455/295, 323, 325, 326, 455/303–305; 332/18, 37 R

[56] References Cited

U.S. PATENT DOCUMENTS 3,159,790  12/1964  Pratt .................................... 455/326
3,515,993  6/1970   Merriam .............................. 455/326
4,126,828  11/1978  Kumagai ............................. 455/295

Primary Examiner—Jin F. Ng
Attorney, Agent, or Firm—Mark P. Kahler; Edward M. Roney; James W. Gillman

[57] ABSTRACT

A mixer circuit is provided which achieves substantially reduced intermodulation distortion products as compared with conventional mixers. The present mixer circuit includes first and second mixers situated in first and second signal paths, respectively. A small portion of the signals incident upon the input of the first mixer are coupled to the input of the second mixer via a first coupler. The first coupler effectively substantially attenuates signals incident upon the first mixer before providing said signals to the input of the second mixer. Intermodulation products as well as desired signals are generated at the outputs of both the first and second mixer. The output of the second mixer is coupled to the output of the first mixer via a second coupler. The second coupler exhibits an appropriate amount of attenuation, such that the intermodulation products which are coupled from the output of the second mixer to the output of the first mixer exhibit an amplitude equal to the first mixer intermodulation products. Thus, the intermodulation products from the first and second mixers meet at the circuit output in such a manner as to destructively interfere with each other resulting in substantial intermodulation product cancellation while the remaining desired signals are provided to the circuit output.

4 Claims, 7 Drawing Figures

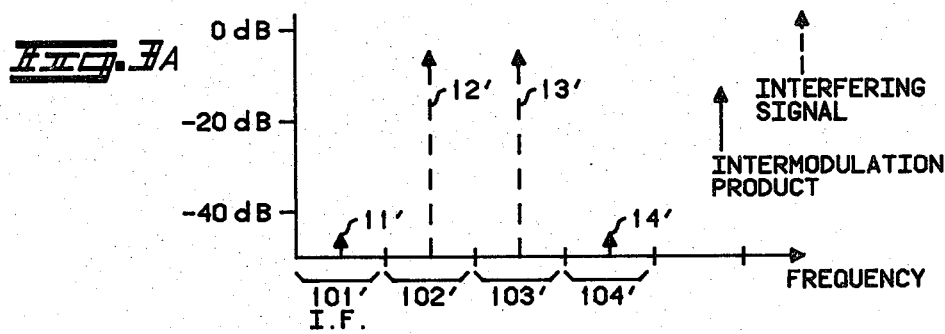
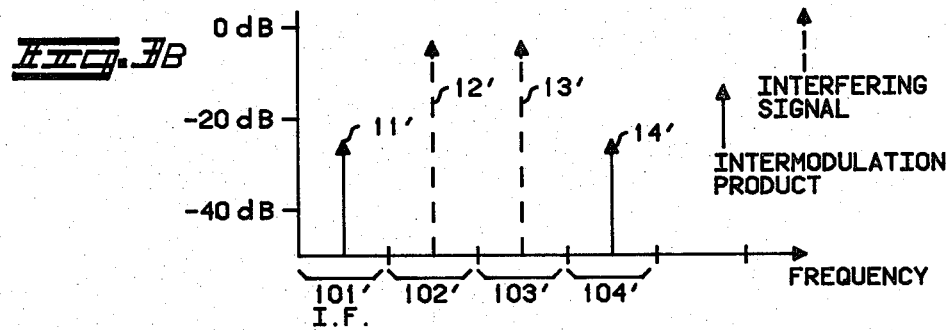
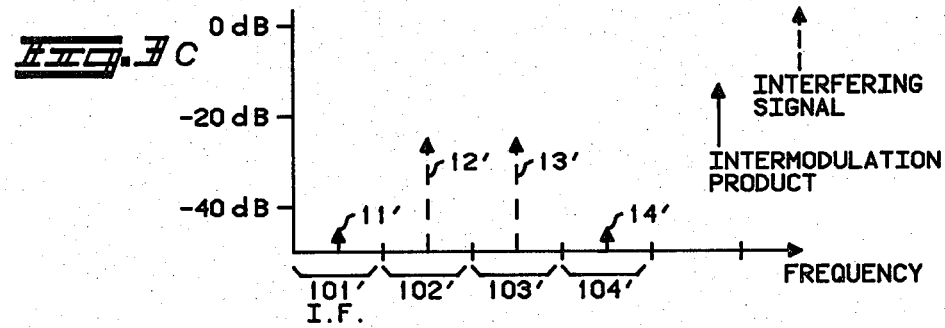
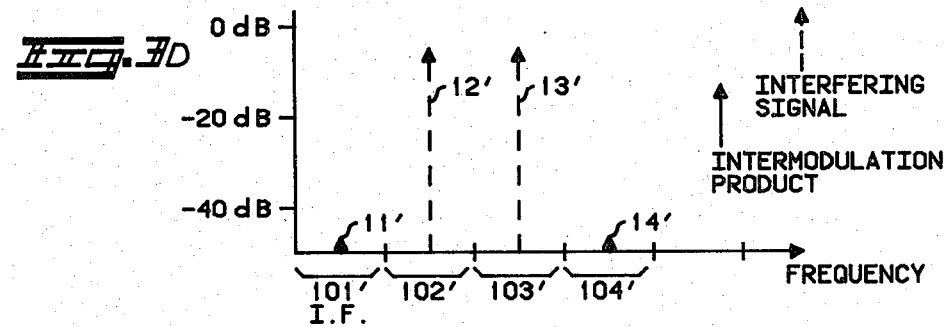

／4,383,334

INTERMODULATION CANCELLING MIXER

BACKGROUND OF THE INVENTION

This invention relates generally to mixer circuits, and more particularly to the substantial elimination of intermodulation distortion products generated in mixer circuits.

DESCRIPTION OF THE PRIOR ART

Several compensation circuits have been devised for reducing the amplitude of intermodulation distortion products (hereinafter "IM products") generated at the output of an amplifier employed to amplify more than one signal. One such compensation circuit includes an input coupler connected to the output of the amplifier to derive a small amount of energy therefrom. The derived energy is transmitted through a sensitive nonlinear device, such as a tunnel diode, which then generates intermodulation distortion components. These generated distortion components are coupled back to the amplifier output line 180 degrees out of phase with the energy on the output line. The 180 degree phase difference causes destructive interference between the distortion components on the amplifier output line and those coupled thereto from the compensation circuit, thereby effectively cancelling out the IM products on the output line. This approach succeeds in suppressing IM products in a general purpose amplifier; however, it does not address the elimination or substantial cancelling of IM products generated in radio frequency mixer circuits to which the present invention is directed.

Accordingly, is one object of the present invention to eliminate or substantially cancel IM products generated in mixer circuits.

Another object of the invention is to reduce IM products generated in a mixer circuit in such a manner that the noise figure is substantially unaffected.

These and other objects of the invention will become apparent to those skilled in the art upon consideration of the following description of the invention.

BRIEF SUMMARY OF THE INVENTION

The present invention is directed to providing a mixer circuit which substantially reduces the amplitude of IM products generated therein without impairing noise figure.

In accordance with one embodiment of the invention, a mixer circuit includes a first channel for mixing signals within a first selected band of frequencies at the input thereof with a signal of predetermined frequency to generate signals within a second selected band of frequencies and IM products.

A second channel is coupled to the input of the first channel to mix a portion of the provided signals within the first selected band of frequencies with the signal of predetermined frequency to generate signals within the second selected band of frequencies and IM products. A combining circuit is coupled to the first and second channel means to combine signals respectively generated thereby in a manner to substantially cancel the IM products and provide output to remaining signals.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

DESCRIPTION OF THE DRAWINGS

FIG. 3A is a graphic representation of signals in the first channel of the mixer prior to combination with signals of the second channel of the mixer.

FIG. 3B is a graphic representation of signals in the second channel of the mixer prior to combination with signals of the first channel of the mixer.

FIG. 3C is a graphic representation of signals in second channel of the mixer after attenuation by coupler 160.

FIG. 3D is a graphic representation of the output signal of the mixer circuit of the invention after combination of the signals from the first and second channels.

DETAILED DESCRIPTION OF THE PREFERRED EMBODIMENT

Figure 1A:
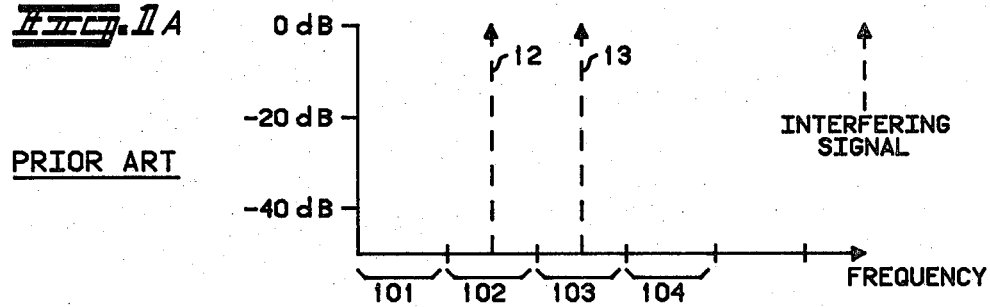
FIG. 1A shows a frequency versus amplitude graph of a plurality of communications channels.

FIG. 1A is a frequency versus amplitude graph of a plurality of adjacent communications channels designated channels 101, 102, 103, 104 and so forth. Channel 101 is defined to be the channel on which a desired signal is to be received, that is, the channel to which a receiver is tuned. Channels 102 and 103 are communications channels adjacent to channel 101 on which interfering signals 12 and 13 are respectively present. Interfering signals 12 and 13 are represented by dashed vertical arrow-like lines.

Figure 1B:
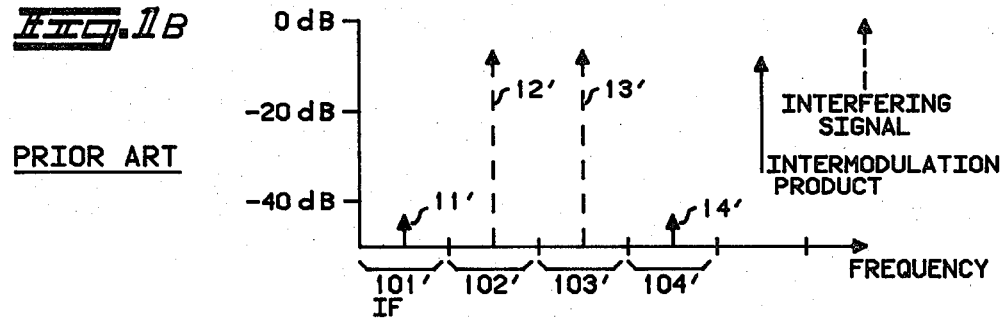
FIG. 1B shows a graph of frequency versus amplitude which depicts an intermediate frequency channel (IF) and two frequency translated adjacent channels occupied by interfering signals.

When interfering signals 12 and 13, together with the desired signal (not shown) on channel 101, are passed through a conventional mixer circuit to translate or down convert the desired signal to a lower selected frequency, namely the intermediate frequency (IF), interfering signals 12 and 13 interact with each other and the local oscillator signal to generate undesired IM products at the desired intermediate frequency 101' IF. FIG. 1B shows the interfering signals after such frequency translation by a conventional mixer as interfering signals 12' and 13' on corresponding channels 102' and 103', respectively, adjacent to the desired intermediate frequency channel 101'. IM products generated in this process of frequency translation are shown as vertical arrows 11' and 14', respectively situated in the IF channel 101' and translated channel 104'. Generation of such intermodulation products in the IF channel 101' causes distortion of desired signals (not shown) generated within the IF bandwidth of channel 101'. The present invention substantially cancels such IM products appearing within the IF bandwidth.

Figure 2:
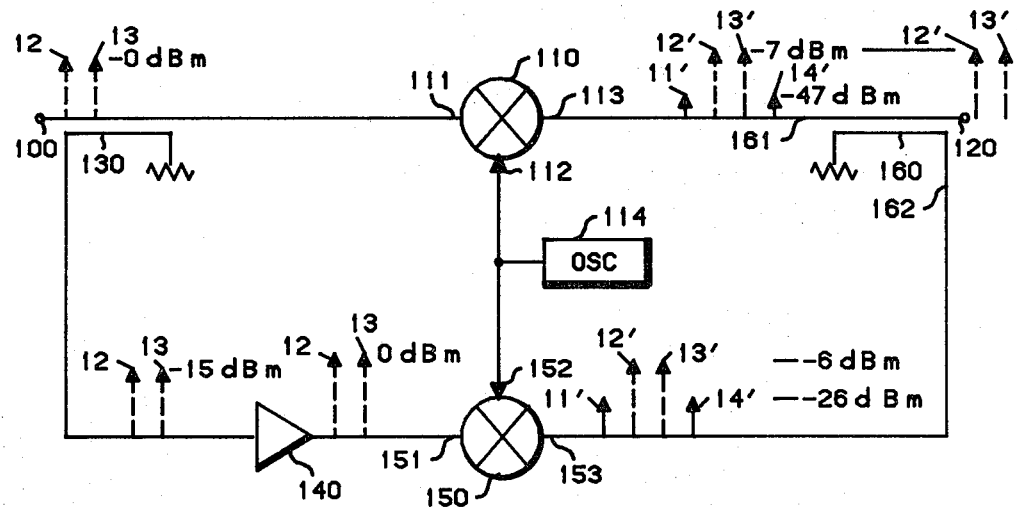
FIG. 2 shows one embodiment of the mixer circuit of the present invention.

In accordance with the invention, FIG. 2 shows an intermodulation cancelling mixer circuit including an input 100 to which radio frequency signals to be received are provided. To enable a basic understanding of the mixer of the invention, the mixer will be discussed in the case where a desired radio frequency signal and two interfering signals such as signals 12 and 13 shown in FIG. 1A are provided to input 100. Referring again to FIG. 2, the interfering signals and the IM products caused thereby are respectively shown as vertical dashed arrows and vertical solid arrows. The amplitudes of such signals are relative and are not drawn to scale. Interfering signals 12 and 13 are assigned a relative value of 0 dBm. As seen in FIG. 2, circuit input 100 is coupled to the input 111 of a mixer 110 such that the desired radio frequency signal and interfering signals 12 and 13 are provided to the input 111 of mixer 110. Mixer 110 includes a local oscillator input 112 which is coupled to a local oscillator 114 which generates an appropriate frequency to mix down signals at mixer input 111 to the desired intermediate frequency. Mixer circuit output 113 is coupled to circuit output 120 which comprises the overall output of the circuit of the invention. One mixer which may be employed as mixer 110 is a high power mixer circuit exhibiting a third order intercept point at input 111 of +20 dBm and a conversion gain of −7 dB. Such a mixer results in interfering signals 12' and 13' having an amplitude of −7 dBm and intermodulation products 11' and 14' having an amplitude of −47 dBm being generated at mixer output 113 as shown in FIG. 2 and more clearly in FIG. 3A. The path of signal flow from input 100 through mixer 110 comprises a first channel.

A coupling circuit 130 such a directional coupler well known to those skilled in the art is coupled between input 100 and mixer input 111 to couple a portion of the signal energy from the first channel to a second channel in the manner described below. As shown in FIG. 2, coupler 130 is connected to the input of an amplifier 140 such that the desired radio frequency signal together with interfering signals 12 and 13 are provided thereto. In this embodiment, coupler 130 exhibits an attenuation of −15 dB and thus the amplitude of interfering signals 12 and 13 is −15 dBm at the input of amplifier 140. Amplifier 140 exhibits a gain of 15 dB and thus the interfering signals 12 and 13 generated at the output of amplifier 140 exhibit an amplitude of 0 dBm. The output of amplifier 140 is coupled to an input 151 of a mixer 150. Mixer 150 includes a local oscillator input 152 coupled to local oscillator 114 which generates an appropriate frequency to mix down the desired radio frequency signals to the selected intermediate frequency (IF) and to mix down interfering signal 12 and 13 to the channels adjacent to the selected IF. In this particular embodiment, mixer circuit 150 exhibits a third order intercept point at input 151 of +10 dBm and a conversion gain of −6 dB. Thus, mixer 150 is a low power mixer as compared to high power mixer 110.

FIG. 3B is a graphic representation of the relative amplitudes (not to scale) of the intermodulation products and interfering signals generated at the output of mixer 150. As seen in FIGS. 2 and 3B, the frequency translated interfering signals 12' and 13' generated at the output 153 of mixer 150 exhibit an amplitude of −6 dBm while the IM products at the same point exhibit an amplitude of −26 dBm.

Amplifier 140 and mixer 150 together comprise a second channel or path. The signals at the output of the first channel and at the output of the second channel are combined by connecting mixer outputs 113 and 153 to respective inputs 161 and 162 of a coupler 160 as shown in FIG. 2. Coupler 160 is selected to exhibit an attenuation to signals at input 162 of an amount necessary to cause the amplitude of the IM products of the second channel to be equal to the amplitude of the IM products of the first channel when such signals are combined at coupler 160. Thus, in this particular embodiment wherein the IM products at the output of the first channel (mixer output 113) exhibit an amplitude of −47 dBm and the IM products generated at the output of the second channel (mixer output 153) exhibit an amplitude of −26 dBm, coupler 160 is selected to provide an attenuation of −21 dB (that is, −26 dBm−21 dBm = −47 dBm). FIG. 3C depicts interfering signals 12' and 13' of the second channel and IM products 11' and 14' of the second channel after such attenuation. Since amplifier 140 has 180° of phase shift, the interfering signals and IM products at coupler input 162 are 180° out of phase with the interfering signals and IM products at coupler input 161. Thus, when such IM products of equal amplitude (interfering signals are not of equal amplitude) from the first and second channels are combined at coupler 160, the IM products are substantially canceled resulting in the interfering signals 12' and 13' remaining at circuit output 120 essentially unaltered. Some very low level residual IM products 11' and 14' as shown in FIG. 3D together with the desired mixed down radio frequency signal (not shown) are present at circuit output 120. Since the amplitudes of interfering signals 12' and 13' of the second channel are approximately 100 times smaller in power than the interfering signals 12' and 13' of the first channel, such interfering signals from the second channel have little effect on the amplitude of the interfering signals of the first channel when combined therewith at coupler 160, as is the case with a desired mixed down radio signal. The interfering signals 12' and 13' which remain at output 120 thus have an amplitude of approximately −7 dBm as shown in FIG. 2 and FIG. 3D.

In accordance with the above described mixer circuit, a method is provided for cancelling intermodulation products which includes a step A of mixing signals within a first selected band of frequencies with a signal having a predetermined frequency to generate, at a first point, signals within a second selected band of frequencies and intermodulation products. Step B of the method includes mixing a portion of the signals within the first selected band of frequencies with a signal of the predetermined frequency to generate, at a second point, signals within the second band of frequencies and intermodulation products. The signals at the second point are reversed in phase as compared with the signals at the first point. Step C of the method includes combining the signals generated at the first point with the signals generated at the second point to substantially cancel out intermodulation products thereof while providing output to the signals remaining.

The foregoing describes a method and mixer circuit which, in the embodiment shown, down converts radio frequency signals in such a manner as to cancel undesired IM products without degrading the noise figure of the mixer.

While only certain preferred features of the invention have been shown by way of illustration, many modifications and changes will occur to those skilled in the art. It is, therefore, to be understood that the present claims are intended to cover all such modifications and changes as fall within the true spirit of the invention.

I claim:
1. A mixer circuit comprising:
first mixing means, having an input and an output, for mixing desired and interfering signals within a first selected band of frequency with a signal of predetermined frequency to generate signals within a second selected band of frequencies and intermodulation products;

coupler means for coupling to the input of said first mixing means for attenuating said interfering signals at the output of said coupler means;

second mixing means, operatively coupled to the output of said first coupler means, for mixing the output of said coupler means with a signal of said predetermined frequency to generate signals within said second selected frequency band of frequencies and intermodulation products, and combining means, having first and second inputs coupled to the outputs of said first mixing means and said second mixing means, respectively, for combining signals respectively generated thereby in a manner which attenuates signals generated by said second mixing means by an amount sufficient to cause intermodulation products generated by said second mixing means to be equal in amplitude to intermodulation products generated by said first mixing means thereby substantially cancelling such intermodulation products to provide said desired signals.

2. The mixer circuit of claim 1 including amplifying means, coupled between said coupler means and said second mixing means, for amplifying signals generated by said coupler means such that the intermodulation products generated by said second mixing means thereby are substantially equal in amplitude to the intermodulation products generated by said first mixing means, but reversed in phase.

3. The mixer circuit of claim 1 wherein said first mixing means comprises a high power mixer.

4. The mixer circuit of claim 1 wherein said second mixing means comprises a low power mixer.

* * * * *